United States Patent
Iwasaki et al.

(10) Patent No.: US 6,477,038 B2
(45) Date of Patent: *Nov. 5, 2002

(54) ELECTRONIC APPLIANCE

(75) Inventors: Kazumi Iwasaki, Nara (JP); Keiji Inaba, Katano (JP); Kazutomo Higa, Neyagawa (JP)

(73) Assignee: Matsushita Electric Industrial Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,015

(22) Filed: May 21, 1999

(65) Prior Publication Data
US 2002/0030971 A1 Mar. 14, 2002

(30) Foreign Application Priority Data
May 26, 1998 (JP) ............................................. 10-143894

(51) Int. Cl.⁷ ................................................. H05K 5/00
(52) U.S. Cl. ........................ 361/679; 361/749; 361/752; 361/792; 361/796; 361/688
(58) Field of Search ................... 106/18.29; 174/121 A, 174/256–258; 361/704, 705, 707–708, 749-7, 760; 427/96, 97

(56) References Cited

U.S. PATENT DOCUMENTS 5,843,215 A * 12/1998 Whalon et al. .......... 106/18.29

FOREIGN PATENT DOCUMENTS

| DE | 3612318 | 10/1987 |
| EP | 0 856 556 | 8/1998 |
| EP | 0 953 611 | 11/1999 |
| JP | 2-20094 | 1/1990 |
| JP | 9-007757 | 1/1997 |

OTHER PUBLICATIONS

Derwent Abst. of Japan '094, Jan. 23, 1990.*

* cited by examiner

Primary Examiner—Gregory Thompson
(74) Attorney, Agent, or Firm—Parkhurst & Wendel, L.L.P.

(57) ABSTRACT

Invasion of insects into electronic appliances is prevented, nesting of insects in the electronic appliances is prevented, and these preventing actions are maintained for a long period. Further, troubles of electronic appliances due to invasion of insects are decreased. Insect control measures may be applied in all electronic appliances including small and lightweight types. It includes (a) a housing, and (b) an electronic circuit disposed in the housing. The electronic circuit includes a printed wiring board having an electronic material containing a repellent, and an electronic component mounted on the printed wiring board. The electronic material containing the repellent is paste, solder resist, parts layout, insulating resin, prepreg cured piece, resin film, or polyimide film.

10 Claims, 3 Drawing Sheets

ELECTRONIC APPLIANCE

FIELD OF THE INVENTION

The present invention relates to an electronic appliance, and more particularly to an electronic appliance using printed wiring boards.

BACKGROUND OF THE INVENTION

Recently, as the electronic appliances are diversified and the dining industry is growing, there is a mounting demand for reliability of electronic appliances used in the professional kitchens, restaurants and others, and insect countermeasures are required in the electronic appliances.

In the electronic appliances used in household kitchen, unpleasant and harmful insects such as cockroaches may cause troubles on electronic appliances. Moreover, electronic appliances used continuously by feeding a feeble current are increasing in number, and the electronic appliances are installed in the living room or other living environments. In winter, in particular, electronic appliances may be a comfortable habitat for insects preferring the warmer place.

However, little has been considered about measures against insects invading into electronic appliances. Troubles of electronic appliances due to dead bodies or wastes of insects were hardly made public. Accordingly, insect countermeasures were not generally applied within the electronic appliances. Only the shape of the housing of electronic appliances was slightly modified for this purpose.

As measures for repelling insects, structural designs have been hitherto considered, such as enclosure of electronic appliances, and placing of shielding plates to prevent invasion of insects onto the printed wiring board after mounting of parts. As the electronic appliances are becoming more and more smaller, such measures are difficult. In particular, many electronic appliances have restrictions such as necessity of cooling of electronic circuits and structure of appliance, and it is difficult to design electronic appliances having no opening, hole or gap, and it is impossible to constitute electronic appliances completely shutting off the cooling parts and opening parts.

Insects, once invading into the electronic appliance, can hardly get out. In particular, baby cockroaches get into the electronic appliances from tiny gaps, and grow up in the electronic appliances. In this way, cockroaches proliferate in the electronic appliances. When these insects or dead bodies contact with live parts or high voltage parts of the electronic appliance, it may lead to malfunction, heat generation, or other troubles.

Conventional measures for repelling insects include, among others, a method of applying an insect repellent paint on the housing, a method of adhering a repellent tape to cover the gap, bottom hole or opening of electronic appliance, a method of using a packing member or sealing member adsorbing a repellent on the housing. Such measures, however, require a larger size for the electronic appliance, being contrary to the recent need for smaller size and lighter weight. Yet, if insects invade into the electronic appliances, insects build up nest, and nesting cannot be prevented by such measures.

It was also attempted to mold the printed wiring board containing electronic components with an insect repellent paint after forming an electronic circuit by mounting electronic components on the printed wiring board. Such conventional measures are accompanied by lowering of insulation reliability of printed wiring board due to molding of insect repellent, deterioration of durability, drop of cooling performance of heat generating parts such as electrolytic capacitors and power transistors, dissipation of repellent chemical due to heat generation of printed wiring board, lowering of insect repellent effect due to evaporation of repellent chemical, increase in the number of processes after mounting, and difficult of inspection of electronic circuit. Ultimately such measures were not widely employed.

SUMMARY OF THE INVENTION

An electronic appliance of the invention comprises (a) a housing, and (b) a printed wiring board having an electronic material containing a repellent, and an electronic circuit having electronic components mounted on the printed wiring board. The electronic circuit is placed in the housing.

Preferably, the electronic material is at least one selected from the group consisting of paste, solder resist, parts layout, insulating resin, prepreg, and resin film.

Preferably, the electronic components have heat generating parts.

Preferably, the housing has at least one of an opening and a penetration hole for placing components.

In this constitution, without lowering the quality characteristic of the printed wiring board, the printed wiring board itself is effective to prevent nesting by insects. It is also possible to reduce in size and weight, and an electronic appliance having excellent repellent effects is obtained. In and after mounting process, electronic components are free from adverse effects, and an electronic appliance having an excellent repellent effect is obtained. The cooling performance is not impaired, and an electronic appliance having an excellent repellent effect is obtained.

That is, even after mounting electronic components on the printed wiring board, the reliability of the electronic components and electronic circuit is not lowered, and nesting suppressing effects of insects in the electronic appliance are maintained, and the rate of troubles due to insects is lowered, and the electronic appliance capable of enhancing the cleanliness around the appliance is obtained.

REFERENCE NUMERALS

Figure 1:
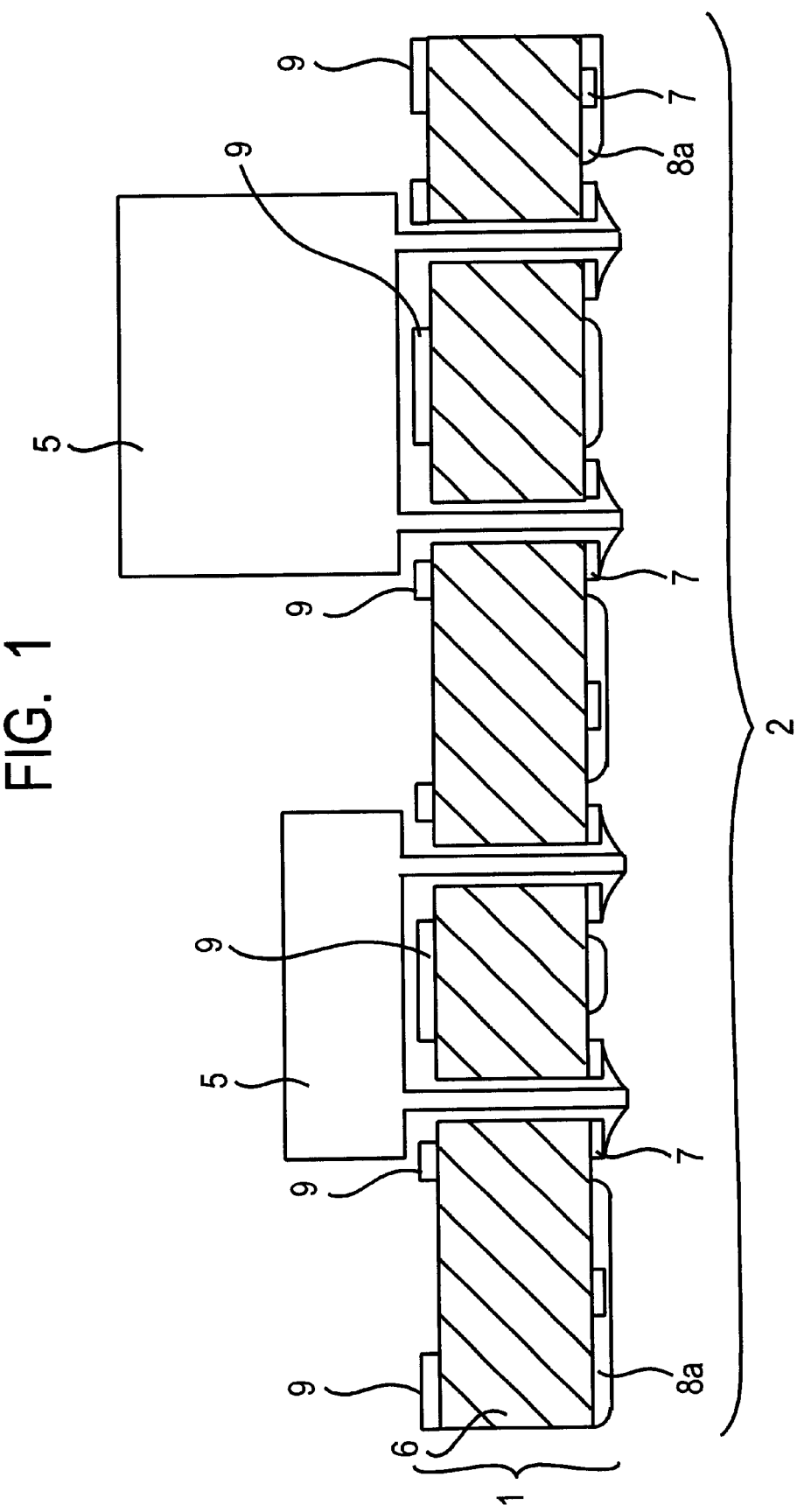
FIG. 1 is a sectional view of an electronic circuit mounting electronic components on a printed wiring board of an electronic appliance in an embodiment of the invention.

1 Printed wiring board
2, 2a, 2b Electronic component
3a, 3b Multilayer printed wiring board
4 Electronic circuit
5 Electronic component
6 Insulating substrate
7 Conductor circuit
8a, 8b Solder resist
9 Parts layout
10 Inner layer substrate
11 Prepreg
12 Insulating layer resin
13 Contact pattern
14 Paste
15 Electronic appliance 16 Housing of electronic appliance
17 Motor drive unit
18a, 18b Opening
19 Battery compartment
20 Operation unit
21 Pushbutton

DETAILED DESCRIPTION OF THE INVENTION

An electronic appliance of the invention comprises a printed wiring board having an electronic material containing a repellent, and electronic components mounted on the printed wiring board. The printed wiring board and the electronic components form an electronic circuit. The printed wiring board is formed by using the electronic material containing the repellent. By using the printed wiring board having the nesting preventive effect as the electronic circuit, an electronic appliance having insect control measures to be free from adverse effects on electronic components and cooling performance after mounting of components is obtained.

Preferably, the electronic material containing the repellent is a paste. In this constitution, the paste can be selectively applied to desired positions on the printed wiring board. Accordingly, the insect repellent layers can be placed at invading positions of insects and locations where nests are likely to be formed, so that the insect repelling and nesting suppressing effects may be effectively utilized.

Preferably, the electronic material containing the repellent is a solder resist. In this constitution, the insulating layer containing the resist can be placed on the conductor circuit of the printed wiring board. As a result, the insulating layer having an excellent insect repellent effect can be placed on a wide area in the electronic appliance, and the electronic appliance having excellent insect repelling and nesting suppressing effects is obtained.

Preferably, the electronic material containing the repellent is a parts layout. In this constitution, the parts layout can be placed selectively on the printed wiring board. Accordingly, by the same number of processes as in the prior art, an electronic appliance having excellent insect repelling and nesting suppressing effects is obtained.

Preferably, the electronic material containing the repellent is an insulating resin. In this constitution, the insulating resin can be used as an overcoat used in a silver through-hole printed wiring board, jumper wiring or other two-layer printed wiring board, and may be also used as an insulating layer of build-up type multilayer printed wiring board having a laminated structure of insulating layer and conductive layer. Hence, by the same number of processes as in the prior art, a small-sized electronic appliance having excellent insect repelling and nesting suppressing effects is obtained.

Preferably, the electronic material containing the repellent is a prepreg. In this constitution, a plurality of prepregs may be laminated together with copper foils. Hence, by the same number of processes as in the prior art, one side or both sides of the multilayer printed wiring board or the base material itself of the electronic appliance has excellent insect repelling and nesting suppressing effects.

Preferably, the electronic material containing the repellent is a resin film or a thermosetting resin film. In this constitution, these resin films can be used as the solder resist of the printed wiring board or the build-up type multilayer printed wiring board. Accordingly, various printed wiring boards having uniform thickness of insulating layer and excellent insect repellent effects can be manufactured, so that an en electronic appliance having excellent insect repellent effects is obtained.

Preferably, the electronic material containing the repellent is a polyimide film. The polyimide film can be used as a flexible printed wiring board or the like. In this constitution, precision electronic appliances or small electronic appliances having excellent insect repellent effects and electronic appliances having bending and driving unit can be obtained.

Preferably, the electronic material contains a filler adsorbing the repellent on the surface. In this constitution, the characteristics as the printed wiring board can be enhanced, and dissipation of the repellent due to heat in mounting process or others can be prevented. As a result, the repellent effect lasts for a long time.

Preferably, the printed wiring board has an electronic material containing at least one layer of repellent placed on the conductor. In this constitution, the electronic materials may be properly selected and combined to be suited to applications as the paste, solder resist, parts layout, or insulating layer resin, so that it is applicable to all types of electronic components.

Preferably, the printed wiring board is a multilayered printed wiring board, and the multilayer printed wiring board can be selected and combined by using the electronic component containing the repellent as the laminate material. By using as laminate material such as insulating resin, prepreg and resin film, it is applicable to all types of multilayer printed wiring board. As a result, it can be used in the small-sized electronic appliance requiring an electronic circuit of high density mounting.

Preferably, the electronic material containing the repellent is a polyimide film, and the printed wiring board is a flexible printed wiring board. This flexible printed wiring board having the insect repellent effect can be used in an electronic circuit of a precision electronic appliance or small-sized electronic appliance such as camera, or an electronic appliance having bending or drive unit, and in this constitution, excellent insect repelling and nesting suppressing effects are realized.

Preferably, the electronic material containing the repellent is a paste or parts layout, and the paste or parts layout is installed outside of the printed wiring board. In this constitution, invasion of insects onto the printed wiring board can be prevented.

Preferably, the electronic material containing the repellent is a paste or parts layout, and the paste or parts layout is place near a heat generating part or a cooling plate. The heat generating part or cooling plate attracts cockroaches or other insects, and presents a nesting temperature atmosphere. Accordingly, by forming the paste film or parts layout containing the repellent beneath or near the heat generating part such as semiconductor or cooling plate, insect repelling and nesting suppressing effects are efficiently realized.

Preferably, the repellent has a pyrolysis temperature of about 250 deg. C or more. The repellent has an action on the nerve transmission system. The soldering temperature of components is generally lower than 250 deg. C. By using the repellent having the higher pyrolysis temperature than the soldering temperature, evaporation or dissipation of the repellent can be suppressed, and a stable repellent effect is obtained. The repellent stimulates only the sensory nerves of insects such as cockroaches and ants other than humans, and a continued insect repellent performance is obtained. The repellent on the nerve transmission system has a greater effect than the olfactory stimulant repellent.

Preferably, the repellent contains a pyrethroid chemical. By mixing a pyrethroid chemical, the safety for the human body is enhanced, and contamination of surrounding environments is prevented.

Preferably, the printed wiring board has a contact pattern or connector terminal. In this constitution, invasion of insects is prevented in an electronic appliance having button keyboard, switch, other pushbutton, or opening for connection of connector with an external device or the like.

Preferably, the printed wiring board using the electronic material containing the repellent is disposed near the bottom or opening of the electronic appliance, or gap or hole of its housing. In this constitution, cockroaches or other insects can hardly invade into the inside of the housing of the electronic appliance. As a result, invasion of insects into the housing of the electronic appliance can be prevented.

Preferably, the printed wiring board using the electronic material containing the repellent is disposed in the opening of the electronic appliance, or between the gap in the housing of the electronic appliance and the heat generating part in the electronic appliance. The heat generating part includes the control unit, power source and motor. The opening in the electronic appliance or the gap in the housing is an invasion route of insects. The heat generating part is a comfortable habitat for insects. When the printed wiring board having the repellent is disposed near such opening or heat generating part, the insect repellent effect is further enhanced.

Preferably, the electronic appliance has keyboard, switch and pushbutton, and the printed wiring board has a contact pattern corresponding to the pushbutton. Even in the electronic appliance including a slight gap, invasion of insect into the housing of the electronic appliance can be prevented by the repellent effect of the printed wiring board.

Preferably, the cooling and actual operating temperature range of the electronic appliance is about 20 to about 40 deg. C. Generally, the habitat temperature of cockroaches and other insect is in a range of about 20 to about 40 deg. C. In this constitution, therefore, the insect repelling and nesting suppressing effects are enhanced.

Preferably, the electronic circuit includes at least one selected from the group consisting of power source circuit, high voltage transformer circuit, and magnetron drive circuit. The power source circuit, high voltage transformer circuit and magnetron drive circuit generate heat when the circuit is put in operation. Therefore, in such electronic circuit as power source circuit, high voltage transformer circuit and magnetron drive circuit, cockroaches and insects are likely to be attracted, and hence invasion preventive effects of insects is enhanced by such constitution.

In the invention, the paste refers to any one of paste film, paste layer and paste member cured and formed by using a paste. The solder resist refers to any one of solder resist film, solder resist layer or solder resist member cured and formed by using a solder resist. The prepreg refers to a cured piece formed by using a prepreg.

Referring now to the drawings, exemplary embodiments of the invention are described in detail below.

Figure 2:
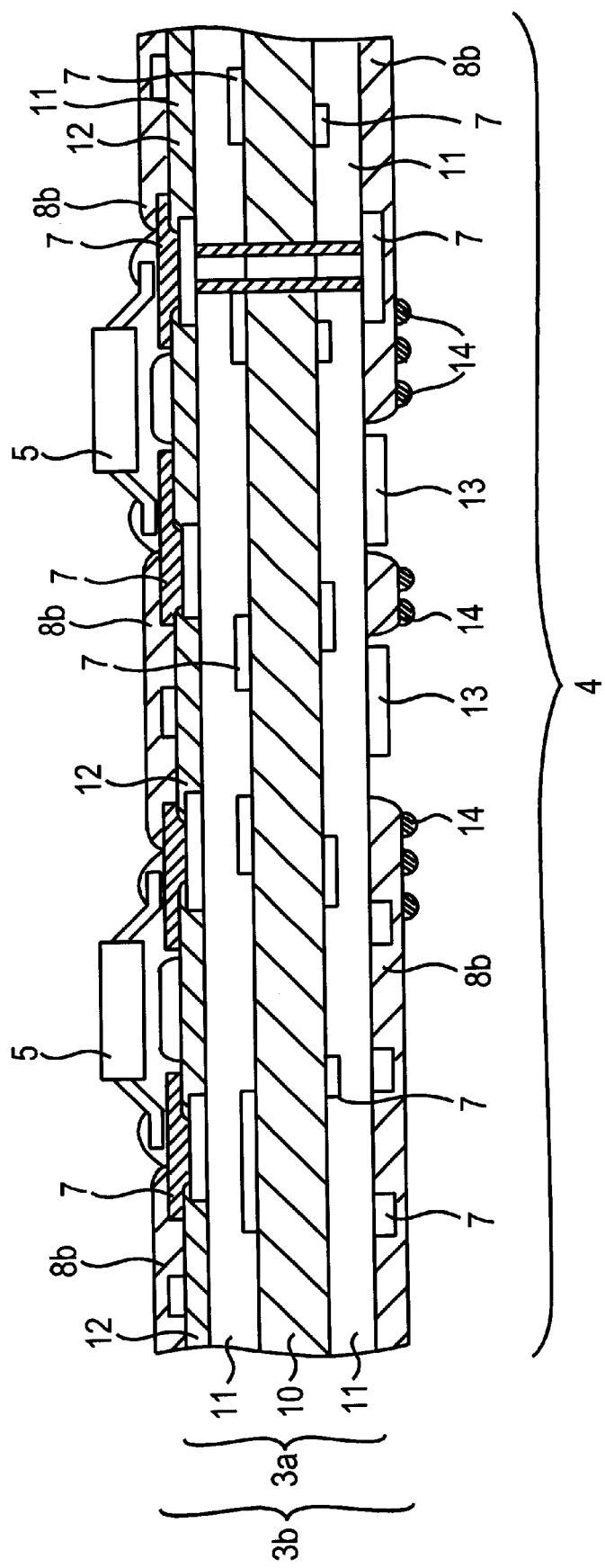
FIG. 2 is a sectional view of an electronic circuit mounting electronic components on a multilayer printed wiring board of an electronic appliance in an embodiment of the invention.
Figure 3:
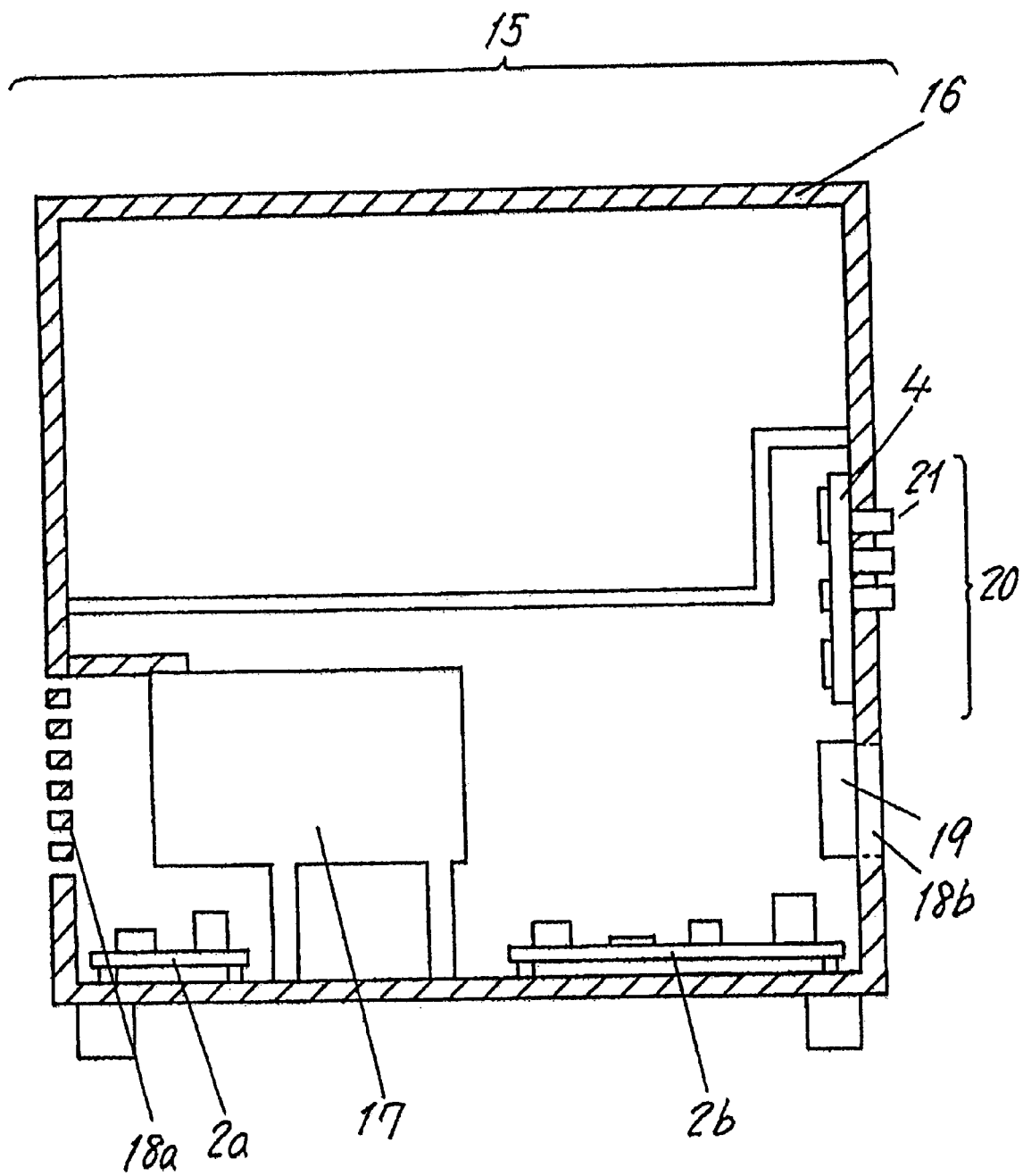
FIG. 3 is a schematic sectional view showing a constitution of an electronic appliance in an embodiment of the invention.

FIG. 1 is a sectional view of a printed wiring board and electronic circuit used in an electronic appliance in an exemplary embodiment of the invention. FIG. 2 is a sectional view of a multilayer printed circuit board and an electronic circuit used in an electronic appliance in an exemplary embodiment of the invention. FIG. 3 is a schematic sectional view showing a constitution of an electronic appliance in an exemplary embodiment of the invention.

In FIG. 1, an electronic circuit 2 comprises a printed wiring board 1 having through-holes, and electronic components 2 mounted on the printed wiring board 1. The printed wiring board 1 has insulating substrates 6, and conductor circuits 7, solder resists 8a, and parts layouts 9 placed on the insulating substrate 6. The parts layout 9 is placed at the face surface side of the insulating substrate 6. The conductor circuit 7 is placed at the back surface side of the insulating substrate 6. One of the solder resists 8a is placed to cover the conductor circuit 7. The electronic components 5 are connected to the conductor circuit 7, and are placed at the face surface side of the insulating substrate by penetrating through the through-holes.

In FIG. 2, an electronic circuit 4 has multilayer printed substrates 3a, 3b, and electronic components 5. The multilayer printed substrates 3a, 3b include inner layer substrate 10, prepreg 11, conductor circuit 7, solder resist 8b, insulating layer resin 12, contact pattern 13, paste 14, and electronic component 5.

In FIG. 3, an electronic appliance 15 comprises a housing 16, electronic circuits 2a, 2b, an electronic circuit 4 having multilayer printed wiring board, a motor drive unit 17, openings 18a, 18b, a battery compartment 19, and an operation unit 20 having pushbuttons 21.

An electronic appliance having thus constituted printed wiring boards, multilayer printed wiring boards and electronic circuits is described below.

First of all, the constitution of power source circuit as one of the electronic circuits 2, 2a, 2b for composing the electronic appliance, the printed wiring board 1 having a drive circuit, and each one of the electronic circuits 2, 2a, 2b is described.

As shown in FIG. 1, a solder resist is applied on the insulating substrate 6 forming the conductor circuit 7, and this solder resist 8a is cured, and a solder resist film 8a is formed. The parts layout 9 as the electronic material is applied and formed at a specific width of 1 to 5 mm beneath or near the electronic component 5 such as transistor as heat generating part, and on the outer circumference of the printed wiring board 1.

This parts layout 9 contains a repellent chemical for repelling cockroaches and other insects. The parts layout 9 contains at least one filler such as silica, talc, barium sulfate or the like, and the repellent adsorbed on the filler. The repellent has a pyrolysis temperature of about 250 deg. C or higher. In this constitution, in the soldering or mounting process, evaporation of the repellent is prevented. As a result, the durability of the repellent effect is enhanced. The repellent is a chemical mixing a pyrethroid chemical acting on the nerve transmission system. By using this pyrethroid chemical, the safety for the human body is enhanced, and contamination of surrounding environments is prevented.

In other constitution, a paste film as electronic material containing the same component as the repellent is applied near the heat generating and heat releasing circuits and formed in spots or mesh. That is, the paste containing the repellent is applied on the surface of the electronic circuit, and the applied paste is cured, and the paste film is formed. Heat generating and heat releasing circuits include the power source circuit on the printed wiring board 1, drive circuit of motor or magnetron, and high voltage transformer circuit. In this constitution, the repellent effect is further enhanced.

On the printed wiring board 1, electronic components 1 are mounted and soldered. Thus, the electronic circuits 2 of electronic appliance used in the power source circuit and drive circuit are composed.

Next, as one of the electronic circuits 4 for composing the electronic appliance, a constitution of an electronic circuit using a multilayer printed wiring board having a control circuit and an operation unit is described below.

As shown in FIG. 2, a plurality of prepregs 11 as electronic material, and copper foils as outermost layer are laminated with an inner layer substrate 10 forming conductor layers 7, and heat-bonded. The prepreg 11 has a glass cloth base material, and a thermosetting resin formed on the glass cloth base material. The thermosetting resin contains the same repellent as mentioned above. That is, the prepreg 11 contains the repellent. As the prepreg 11 containing the thermosetting resin is cured, a prepreg cured piece is formed. Thus, the multilayer printed wiring board 3a is formed. This method is an application of a subtractive method.

The insulating resin layer 12 as electronic material and the conductor circuit 7 are laminated in layers on one side of the multilayer printed wiring board 3a by build-up lamination method such as additive method. The insulating layer resin 12 includes a filler adsorbing the repellent, a thermosetting resin, and a hardener. That is, the insulating resin layer contains the repellent. Thus, the multilayer printed wiring board 3a of build-up type is composed. On the other side of the multilayer printed wiring board 3a, a contact pattern 13 is disposed at a position for connecting pushbuttons of the electronic appliance.

The solder resist 8b contains the repellent. This solder resist 8b is placed on the surface of the prepreg 11 to cover the conductor circuit 7. However, the solder resist 8b is formed on the entire surface except for the positions of soldering land and contact pattern 13.

To further enhance the repellent effect, the parts layout containing the repellent may be disposed near the transistor, IC or contact pattern. The transistor, IC and contact pattern compose a control circuit.

Alternatively, the paste 14 containing the repellent may be selectively placed at most needed positions. This constitution can efficiently enhance the repellent effect. For example, in FIG. 2, the paste 14 containing the repellent is placed on the surface of the solder resist film 8b. However, when the paste 14 containing the repellent is placed on the surface of the solder resist 8b, the solder resist 8b may not contain the repellent.

Instead of the insulating layer resin 12, the resin film containing the repellent may be used. In this case, an insulting layer of a uniform film thickness is formed.

Electronic components 5a are mounted and soldered on the multilayer printed wiring board 3b. In this way, the electronic circuit 4 having the lower side containing the control circuit and the upper side containing the operation unit is composed.

Thus, the electronic material containing the insect repellent is applicable to various printed wiring boards such as multilayer printed wiring board of build-up type from one side, so that insect control measures are realized in all types of small-sized electronic appliances.

In the embodiment, the repellent is contained in the prepreg cured piece 11, insulating resin 12, solder resist film 8b, resin film (substitute for insulating resin 12), paste 14, and parts layout 9, but not limited to this constitution, for example, the repellent may be contained in at least one selected from the group consisting of the prepreg cured piece 11, insulating resin 12, solder resist 8b, resin film, paste 14, and parts layout 9.

A constitution of an embodiment of an electronic appliance using the aforesaid electronic circuit 2 and electronic circuit 4 is described below while referring to FIG. 3.

Inside the housing 16 of the electronic appliance are disposed a motor or other drive unit 17, an electronic circuit 2a for drive circuit for driving the motor, an electronic circuit 2b for power source circuit, an electronic circuit 4 for control circuit and operation circuit, an opening 18a for cooling the drive unit, a battery compartment 19 for backup battery, openings 18a for battery compartment, an operation unit 29, and pushbuttons 21 for operation, in the configuration as shown in FIG. 3. The housing 16 has penetration holes formed in the side wall, and the pushbuttons 21 are placed in the penetration holes. The opening 81b and penetration holes form holes.

The openings 18a are provided for releasing the heat to outside of the housing. The openings 18a are formed near the drive unit 17 of motor or other heat generating parts. The electronic circuit 2a for drive circuit is disposed near the bottom of the housing 16.

The electronic circuit 2b for power source circuit is disposed between the battery compartment 19 at other end and the motor drive unit 17, and near the bottom of the opening 18b for battery compartment. The electronic circuit 4 having the control circuit and operation circuit is disposed at the side wall, with the forming side of the contact pattern 13 directed outside. The pushbuttons 21 are connected to the contact pattern 13, and are placed in the penetration holes formed in the side wall. A gap is formed between the pushbutton switches 21 and the housing 16. Thus, the operation unit 20 of the electronic appliance 15 is composed.

Generally, cockroaches and other insects tend to be attracted by the heat released from heat generating parts in the electronic appliance. Therefore, insects invade inside from the openings 18a, 18b of the electronic appliance or the gap in the housing 16, and form nests in the route to the heat generating parts or near the heat generating parts. When the external heat releasing temperature or actual operating temperature is in a range of about 20 to about 40 deg. C, or when the heat generating parts are located in the bottom, such habit is particularly manifest.

Considering such habit of the cockroaches and insects, the individual electronic circuits are preferred to be located at the following positions. The electronic circuit 2a for drive circuit is disposed near the openings 18a for releasing heat, and the electronic circuit 2b for power source circuit is disposed in the bottom between the heat generating part of the drive unit 17 of the motor or the like and the opening 18b for battery compartment. As the electronic circuits 2a, 2b, 4 are disposed in such configuration, invasion and nesting of insects are effectively prevented. Moreover, the solder resist 8b and paste 14 containing the repellent are applied and formed around the contact pattern 13 of the electronic circuit 4 formed at the position corresponding to the pushbuttons 21. In this constitution, invasion of insects from a narrow gap near the pushbuttons 21 is prevented.

In the electronic appliances of the embodiments, the cockroach repellent performance was evaluated, and results are shown in Table 1.

The cockroach repellent performance was measured and evaluated in the following method. A paper shelter (nest) and a container of drinking water, electronic appliances using the printed wiring boards formed by using the electronic material containing the repellent in the embodiment, and electronic appliances using conventional printed wiring boards are put in a vinyl chloride vat of 80×100 cm. The electronic appliances using the conventional printed wiring boards do not contain repellent at all. Two electronic appliances of the embodiment, and two conventional electronic embodiments were used. The container is placed in the center. The electronic appliance containing the repellent and the conventional electronic appliances are placed parallel to each other. As insects, German cockroaches are put in this apparatus of experiment.

As German cockroaches, 100 adult male insects and 100 adult female insects were used. In this state, electric power was supplied in the electronic appliances of the embodiment and the conventional electronic appliances. After the lapse of 48 hors, the number of insects forming nests on the printed wiring boards of the electronic appliances of the embodiment and the conventional electronic appliances were measured. The repellent rate was calculated in the following formula.

Repellent rate (%)=100×(number of insects nesting in conventional electronic appliances−number of insects nesting in electronic appliances of embodiment)/number of insects nesting in conventional electronic appliances

TABLE 1

| Number of insects nesting in electronic appliances of embodiment | Sample 1 | 4 insects | Average |
| --- | --- | --- | --- |
|  | Sample 2 | 9 insects | 6.5 insects |
| Number of insects nesting in conventional electronic appliances | Sample 3 | 18 insects | Average |
|  | Sample 2 | 112 insects | 65 insects |

Repellent rate: 90.0%

As known from the results, the repellent rate of the electronic appliances of the embodiment to the conventional electronic appliances was 90.0%. That is, the electronic appliances of the embodiment presented an excellent insect repellent effect.

Although detailed description is omitted in the embodiment of the invention, as the electronic material containing repellent, a polyimide film containing a repellent may be used. The flexible printed wiring board having such polyimide film is used in precision electronic appliance or small-sized electronic appliance such as camera, electronic appliance having drive unit to be often bent, and other electronic circuits. The electronic appliances having such constitution also have the same repellent effect and nesting suppressing effect as mentioned above.

In the embodiment, the pyrethroid chemical is used as the repellent, but not limited to this, other neurotransmitter chemicals can be used. As the insects, cockroaches are used, but not limited to cockroaches, in other insects such as ants, moth, and others, repellent effects are obtained by properly selecting the kind of the repellent.

Thus, according to the constitution of the invention, the electronic appliances having the following effects are obtained. Evaporation of the repellent due to heat when mounting electronic components on the printed wiring board is prevented, and the insect repellent effect is enhanced. After mounting electronic components on the printed wiring board, the reliability of the electronic components and electronic circuits is not lowered, and the durability of the insect repellent effect is enhanced. Invasion of insects into the electronic appliances is prevented, and nesting of insects in the electronic appliances is prevented, and these preventing actions are maintained for a long period. Moreover, troubles of electronic appliances due to invasion of insects are reduced. The cleanliness around the electronic appliance is enhanced. It is further applicable to various types of printed wiring boards such as multilayer printed wiring board of build-up type from one side, and insect control means may be realized in all types of electronic appliances including small and lightweight types.

What is claimed is:

1. An electronic appliance comprising:
   (a) a housing, and
   (b) an electronic circuit including (1) a printed wiring board, and (2) an electronic component mounted on said printed wiring board by soldering, said electronic circuit disposed in said housing, wherein said printed wiring board comprises an electronic material, said electronic material containing a vermin repellent, a plurality of fillers, and a resin, said vermin repellant comprising a neurologically active chemical having a pyrolysis temperature equal to or greater than 250° C., and said vermin repellant is adsorbed to at least one of said plurality of fillers.

2. The appliance of claim 1,
wherein the parts of the printed wiring board is a member or members selected from the group consisting of a paste, a solder resist, a parts layout, an insulating resin, a prepreg, a resin film, and a polyimide film.

3. The appliance of claim 1,
wherein said printed wiring board is a multilayered printed wiring board, and
said multilayered printed wiring board contains the repellent.

4. The appliance of claim 1,
wherein said printed wiring board is a flexible printed wiring board comprising a polyimide film containing the repellent.

5. The appliance of claim 1,
wherein said printed wiring board comprises at least one of paste and a parts layout disposed on a periphery of a surface of said printed wiring board.

6. The appliance of claim 1,
wherein said electronic component has at least one heat generating part or cooling part, and
said printed wiring board is disposed at least at one position selected from the group consisting of a lower part, a surrounding and a vicinity of said heat generating part of said electronic component.

7. The appliance of claim 1,
wherein said electronic component has at least one heat generating part or cooling part, and
said printed circuit board comprises at least one of paste and parts layout disposed near said heat generating part.

8. The appliance of claim 1,
wherein said repellent contains a pyrethroid chemical.

9. The appliance of claim 1,
wherein said printed wiring board has at least one of contact pattern and connector terminal.

10. The appliance of claim 1,
wherein said housing has a bottom and at least one hole of an opening and a penetration hole for placing a component, and said printed wiring board is near at least one of said bottom, said hole of an opening, and said penetration hole.

* * * * *